(12) United States Patent
Yonkee et al.

(10) Patent No.: US 10,685,835 B2
(45) Date of Patent: Jun. 16, 2020

(54) III-NITRIDE TUNNEL JUNCTION WITH MODIFIED P-N INTERFACE

(71) Applicant: The Regents of the University of California, Oakland, CA (US)

(72) Inventors: Benjamin P. Yonkee, Goleta, CA (US); Erin C. Young, Santa Barbara, CA (US); John T. Leonard, San Jose, CA (US); Tal Margalith, Santa Barbara, CA (US); James S. Speck, Santa Barbara, CA (US); Steven P. DenBaars, Goleta, CA (US); Shuji Nakamura, Santa Barbara, CA (US)

(73) Assignees: THE REGENTS OF THE UNIVERSITY OF CALIFORNIA, Oakland, CA (US); KING ABDULAZIZ CITY FOR SCIENCE AND TECHNOLOGY (KACST) (SA)

( * ) Notice: Subject to any disclaimer, the term of this patent is extended or adjusted under 35 U.S.C. 154(b) by 0 days.

(21) Appl. No.: 15/773,864

(22) PCT Filed: Nov. 1, 2016

(86) PCT No.: PCT/US2016/059929
§ 371 (c)(1),
(2) Date: May 4, 2018

(87) PCT Pub. No.: WO2017/079168
PCT Pub. Date: May 11, 2017

(65) Prior Publication Data
US 2018/0374699 A1    Dec. 27, 2018

Related U.S. Application Data

(60) Provisional application No. 62/250,758, filed on Nov. 4, 2015.

(51) Int. Cl.
 *H01L 21/00*   (2006.01)
 *H01L 29/00*   (2006.01)
 (Continued)

(52) U.S. Cl.
 CPC .... *H01L 21/02584* (2013.01); *H01L 21/0254* (2013.01); *H01L 21/0262* (2013.01);
 (Continued)

(58) Field of Classification Search
 CPC ............... H01L 21/00; H01L 21/02631; H01L 21/02458; H01L 21/0254; H01L 21/0262;
 (Continued)

(56) References Cited

U.S. PATENT DOCUMENTS 5,709,745 A      1/1998   Larkin et al.
2003/0178633 A1  9/2003   Flynn et al.
 (Continued)

OTHER PUBLICATIONS

Grundmann et al., "Multi-color light emitting diode using polarization-induced tunnel junctions", 2007, phys. stat. sol., vol. (c) 4, No. 7, pp. 2830-2833, published May 31, 2007.*
 (Continued)

*Primary Examiner* — Nikolay K Yushin
(74) *Attorney, Agent, or Firm* — Gates & Cooper LLP

(57) ABSTRACT

A III-nitride tunnel junction with a modified p-n interface, wherein the modified p-n interface includes a delta-doped layer to reduce tunneling resistance. The delta-doped layer may be doped using donor atoms comprised of Oxygen (O), Germanium (Ge) or Silicon (Si); acceptor atoms comprised of Magnesium (Mg) or Zinc (Zn); or impurities comprised of Iron (Fe) or Carbon (C).

19 Claims, 8 Drawing Sheets

(51) Int. Cl.

| | | |
|---|---|---|
| *H01L 31/18* | (2006.01) | |
| *H01L 33/00* | (2010.01) | |
| *H01L 21/02* | (2006.01) | |
| *H01L 29/15* | (2006.01) | |
| *H01L 29/20* | (2006.01) | |
| *H01L 29/207* | (2006.01) | |
| *H01L 29/36* | (2006.01) | |
| *H01L 29/885* | (2006.01) | |
| *H01L 31/0304* | (2006.01) | |
| *H01L 31/0352* | (2006.01) | |
| *H01L 33/06* | (2010.01) | |
| *H01L 33/32* | (2010.01) | |
| *H01L 29/88* | (2006.01) | |
| *H01L 33/04* | (2010.01) | |

(52) U.S. Cl.
CPC .. *H01L 21/02389* (2013.01); *H01L 21/02458* (2013.01); *H01L 21/02505* (2013.01); *H01L 21/02576* (2013.01); *H01L 21/02579* (2013.01); *H01L 21/02581* (2013.01); *H01L 21/02631* (2013.01); *H01L 29/15* (2013.01); *H01L 29/2003* (2013.01); *H01L 29/207* (2013.01); *H01L 29/365* (2013.01); *H01L 29/885* (2013.01); *H01L 31/03044* (2013.01); *H01L 31/035236* (2013.01); *H01L 31/1856* (2013.01); *H01L 33/0075* (2013.01); *H01L 33/06* (2013.01); *H01L 33/32* (2013.01); *H01L 29/88* (2013.01); *H01L 33/04* (2013.01)

(58) Field of Classification Search
CPC ............. H01L 21/02505; H01L 31/147; H01L 31/03044; H01L 31/0352; H01L 31/035227; H01L 31/032327; H01L 33/14; H01L 33/32; H01L 33/04; H01L 33/0075; H01L 33/06; H01S 5/3095; H01S 5/4043; H01S 5/0262; H01S 5/183; H01S 5/34333; C30B 25/20; C30B 29/406; C30B 23/025; C30B 29/68; Y02E 10/544

See application file for complete search history.

(56) References Cited

U.S. PATENT DOCUMENTS

| | | | |
|---|---|---|---|
| 2009/0050875 A1* | 2/2009 | Kim | H01L 33/02 257/13 |
| 2012/0097920 A1 | 4/2012 | Gwo et al. | |
| 2013/0256681 A1* | 10/2013 | Wang | H01L 29/365 257/76 |
| 2013/0270514 A1* | 10/2013 | Saxler | H01L 33/08 257/13 |

OTHER PUBLICATIONS

Kim et al., "III-nitride ultraviolet light-emitting diodes with delta doping", 2003, Applied Physics Letters vol. 83, No. 3, pp. 566-568, published Jul. 16, 2003.*

Krishnamoorthy et al., "Polarization-engineered GaN/InGaN/GaN tunnel diodes", 2010. Applied Physics Letters 97, pp. 203502-1-203502-3, published Nov. 16, 2010).*

Malinvern et al., "InGaN based micro light emitting diodes featuring a buried GaN tunnel junction", 2015, Applied Physics Letters 107, pp. 051107-1-051107-4, published Aug. 6, 2015.*

Holder et al., "Nonpolar III-nitride vertical-cavity surface emitting lasers with a polarization ratio of 100% fabricated using photoelectrochemical etching", 2014, Applied Physics Letters 105, pp. 031111-1-031111-5, published Jul. 21, 2014.*

Akyol et al., "Tunneling-based carrier regeneration in cascaded GaN light emitting diodes to overcome efficiency droop", 2013, Applied Physics Letters 103, 081107, published online Aug. 23, 2013.*

Krishnamoorthy et al., "GdNNanoisland-Based GaN Tunnel Junctions". 2013, Nano letters, American Chemical Society, 13, pp. 2570-2575, published: May 10, 2013.*

PCT International Search Report and Written Opinion for International Application No. PCT/S2016/59929 filed on Nov. 1, 2016.

J.J. Harris, "Delta-doping of semiconductors," Journal of Materials Science: Materials in Electronics, 4 (1993), pp. 93-94.

E.F. Schubert, "Delta-Doping of Semiconductors: Electronic, Optical, and Structural Properties of Materials and Devices," Semiconductors and Semimetals, vol. 40, 1994, pp. L608-L610.

* cited by examiner

III-NITRIDE TUNNEL JUNCTION WITH MODIFIED P-N INTERFACE

CROSS REFERENCE TO RELATED APPLICATIONS

This application claims the benefit under 35 U.S.C Section 119(e) of the following commonly-assigned application:

U.S. Provisional Application Ser. No. 62/250,758, filed on Nov. 4, 2015, by Benjamin P. Yonkee, Erin C. Young, John T. Leonard, Tal Margalith, James S. Speck, Steven P. DenBaars, and Shuji Nakamura, entitled "III-NITRIDE TUNNEL JUNCTION WITH MODIFIED P-N INTERFACE";

which application is incorporated by reference herein.

This application is related to the following commonly-assigned U.S. patent applications:

P.C.T. International Patent Application No. PCT/US2016/041744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES,"which application claims the benefit under 35 U.S.C Section 119(e) of commonly-assigned U.S. Provisional Patent Application No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES";

which applications are incorporated by reference herein.

BACKGROUND OF THE INVENTION

1. Field of the Invention

This invention relates to a III-nitride tunnel junction with a modified p-n interface.

2. Description of the Related Art (Note: This application references a number of different publications and patent applications as indicated throughout the specification by one or more reference numbers in brackets, e.g., [x]. A list of these different publications and patent applications ordered according to these reference numbers can be found below in the section entitled "References." Each of these publications and patent applications is incorporated by reference herein.)

A number of techniques have been used for improving the performance of semipolar III-nitride optoelectronic devices. The term "III-nitride" refers to any alloy composition of the (Al,Ga,In,B)N semiconductors having the formula $Al_wGa_xIn_yB_zN$, where $0 \leq w \leq 1$, $0 \leq x \leq 1$, $0 \leq y \leq 1$, $0 \leq z \leq 1$, and $w+x+y+z=1$. The term "semipolar" refers generally to any plane of the III-nitride crystal that is not a polar or nonpolar plane, and more specifically, to any plane that has at least two nonzero h, i, or k Miller indices and a nonzero 1 Miller index, such as the (20-21) plane.

Current commercially-available III-nitride devices, such as light-emitting diodes (LEDs), laser diodes (LDs), edge emitting laser diodes (EELDs), vertical cavity surface emitting lasers (VCSELs) and multijunction solar cells, use an active region in a biased p-n junction to allow for electron and hole injection. However, p-type Gallium Nitride (p-GaN) is difficult to contact electrically, and has low hole concentration and mobility. This means that p-GaN cannot be used as a current spreading layer and that traditional p-contacts will add significant voltage to devices. Despite these inherent problems, all commercial light emitting devices utilize a p-contact and a material other than p-GaN for current spreading, typically transparent conducting oxides (TCO).

A very highly doped ($n^+/p^+$) interface can allow for electrons to tunnel between the valence band and conduction band, and is called a tunnel junction (TJ). A low resistance tunnel junction on top of p-GaN allows for current spreading in n-GaN on both sides of the device as well as the use of low resistance n-type contacts on both sides. The use of n-GaN for current spreading allows for the elimination of a TCO or Silver (Ag) mirror in an LED design. The use of low resistance n-contacts on both sides would be especially useful for LDs, where the main resistance comes from the p-contacts.

Thus, there is a need in the art for structures for improving the performance of III-nitride devices. The present invention satisfies this need.

SUMMARY OF THE INVENTION

To overcome the limitations in the prior art described above, and to overcome other limitations that will become apparent upon reading and understanding this specification, the present invention discloses a method for fabricating a III-nitride semiconductor device by performing a growth of a III-nitride tunnel junction with a modified p-n interface, wherein the modified p-n interface includes a delta-doped layer to reduce tunneling resistance.

The method includes performing a first growth of the III-nitride tunnel junction with III-nitride p-type material using metal-organic chemical vapor deposition (MOCVD); depositing the delta-doped layer on the III-nitride p-type material; and performing a subsequent regrowth of the III-nitride tunnel junction with III-nitride n-type material on the delta-doped layer and III-nitride p-type material using a different growth technique than MOCVD, such as ammonia-assisted or plasma-assisted molecular beam epitaxy (MBE).

The delta-doped layer is doped using donor atoms comprised of Oxygen (O), Germanium (Ge) or Silicon (Si); or the delta-doped layer is doped using acceptor atoms comprised of Magnesium (Mg) or Zinc (Zn); or the delta-doped layer is doped using impurities comprised of Iron (Fe) or Carbon (C).

The present invention also discloses a III-nitride semiconductor device fabricated by the method, comprising a III-nitride tunnel junction with a modified p-n interface, wherein the modified p-n interface includes a delta-doped layer to reduce tunneling resistance. The III-nitride semiconductor device comprises one or more III-nitride p-type layers grown by MOCVD; one or more delta-doped layers deposited on the III-nitride p-type layers; and one or more III-nitride n-type layers grown by ammonia-assisted or plasma-assisted MBE on the delta-doped layers and III-nitride p-type layers; wherein the III-nitride p-type layers, delta-doped layers and III-nitride n-type layers form a tunnel junction, a regrowth interface between the III-nitride p-type layers and the III-nitride n-type layers serves as a p-n interface in the tunnel junction, and the delta-doped layers modify the p-n interface.

BRIEF DESCRIPTION OF THE DRAWINGS

Referring now to the drawings in which like reference numbers represent corresponding parts throughout.

DETAILED DESCRIPTION OF THE INVENTION

Figure 1A:
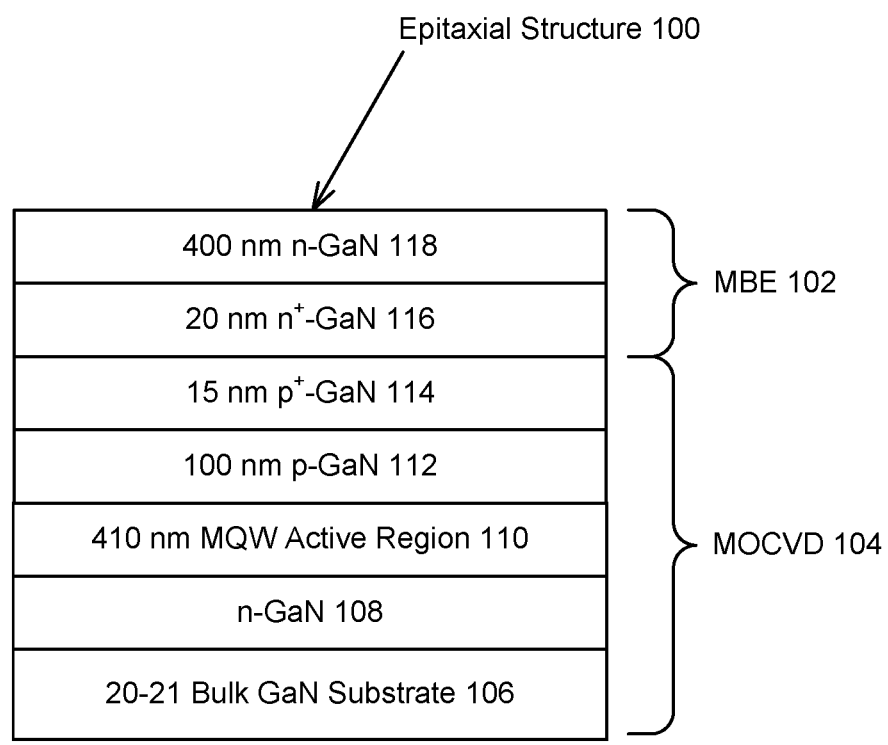
FIG. 1A is a schematic of an epitaxial structure for an MBE tunnel junction grown on an MOCVD LED.

In the following description of the preferred embodiment, reference is made to a specific embodiment in which the invention may be practiced. It is to be understood that other embodiments may be utilized and structural changes may be made without departing from the scope of the present invention.

Overview

The present invention describes the modification of the very highly doped (n+/p+) interface comprising a tunnel junction in III-nitride devices to reduce the energy barrier associated with tunneling and increase the tunneling current. The modification involves introducing extra charge carriers, such as dopant atoms or impurities that result in electronic trap states, that enhance tunneling.

Technical Description

As noted above, a very highly doped (n+/p+) interface can allow for electrons to tunnel between the valence band and conduction band. This was first demonstrated by Esaki in highly doped Ge homojunctions [1] with very thin depletion regions. This type of diode is also known as a tunnel junction.

A low resistance tunnel junction could expand the design space of III-nitride LEDs, LDs, EELDs, VCSELs, multi-junction solar cells, and other optoelectronic devices. A tunnel junction incorporated into these optoelectronic devices allows for the epitaxial structure of the device to use n-GaN on both sides of the p-n interface. This could eliminate p-contacts and replace them with lower resistance n-contacts.

In addition, n-GaN can be used as an effective current spreading layer. The use of n-GaN for current spreading would allow for the elimination of TCO or Silver (Ag) mirrors in optoelectronic device design. The use of low resistance n-contacts on both sides would be especially useful for LDs, where the main resistance comes from the p-contacts.

There have been a number of difficulties in achieving high quality tunnel junctions in the GaN system. GaN is a wide bandgap semiconductor, so the barrier for tunneling is high. Several approaches to reducing the tunneling barrier have been attempted, including bandgap engineering via polarization (AlN interlayers) [2], reducing the bandgap with an InGaN interlayer [3], and introducing defect states via interfacial GdN nanoparticles [4]. However, all of these approaches are associated with losses either in terms of voltage or resistance increases or optical losses in the final device performance.

In principle, a highly-doped Esaki-type homojunction diode should provide the lowest-loss tunnel junction. However, magnesium (Mg) doped p-GaN grown by MOCVD is compensated by hydrogen as grown, and it must be annealed after growth to remove hydrogen. This anneal can only work if the p-GaN is not covered by n-GaN, as hydrogen cannot easily diffuse through n-GaN. This limits the effectiveness of tunnel junctions and prevents their widespread use.

Unlike MOCVD grown p-GaN, MBE grown p-GaN is conductive as grown, which would allow for its use in a tunnel junction. Additionally, the doping limits of MBE materials are higher, which could allow for better tunnel junctions.

In a previous application [5], which is also cross-referenced above, it was shown that combining MOCVD grown light emitters and MBE grown tunnel junctions could reduce the operating voltage devices and increase the efficiency, as is demonstrated in FIGS. 1A-1F, which show the epitaxial structure, tunnel junction design, current voltage operation results, and wavelength vs. intensity.

Specifically, FIG. 1A illustrates an MBE tunnel junction grown on an MOCVD LED, which emits light at a wavelength of about 410 nm. The epitaxial structure 100 is annotated by the respective MBE 102 or MOCVD 104 growth technique to the right of the layers 106-118. The MOCVD 104 growth is performed on a (20-21) bulk GaN substrate 106, and includes an n-GaN layer 108, a 410 nm emitting multi-quantum well (MQW) active region 110, a 100 nm p-GaN layer 112 and a ~15 nm p+-GaN layer 114. An ammonia MBE 102 regrowth is then carried out, which includes a ~20 nm n+-GaN layer 116 followed by a 400 nm n-GaN layer 118 for current spreading. The regrowth interface between the ~15 nm p+-GaN layer 114 and the ~20 nm n+-GaN layer 116 serves as the p-n interface in the tunnel junction.

Thereafter, a mesa etch is performed (not shown) to expose the bottom n-GaN layer 108, as well as isolate the top n-GaN layer 118 from the rest of the substrate 106. A 30/500 nm Ti/Au n-contact layer (not shown) is then deposited using electron beam evaporation on the top and bottom n-GaN layers 118 and 108. The use of two n-contacts can reduce the processing complexity of LEDs by utilizing a single n-contact deposition. The top n-contact is patterned into a probing pad and a thin strip which utilizes the top n-GaN layer 118 for current spreading.

Figure 1D:
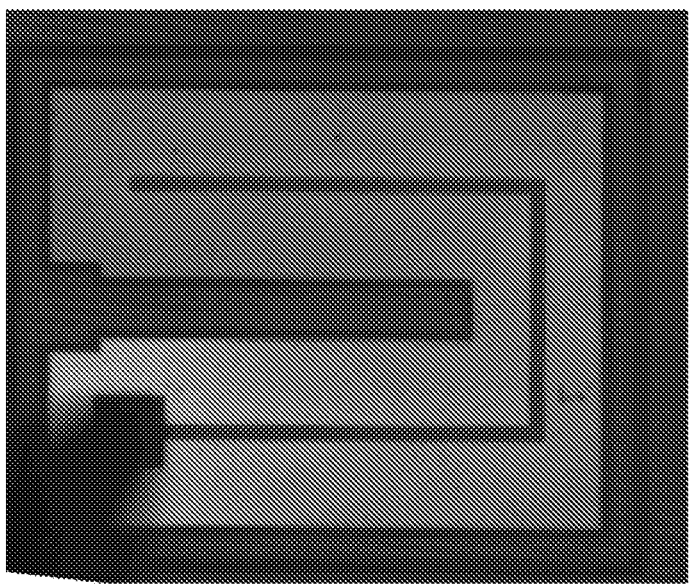
FIG. 1D is an image that shows a standard LED without the tunnel junction with a thin Pd/Au current spreading layer.
Figure 1C:
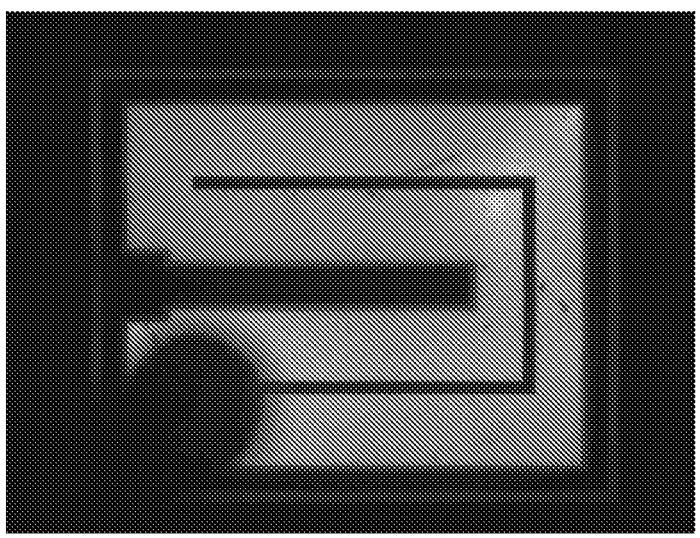
FIG. 1C is an image that shows the device of FIG. 1B under a 20 mA injection current.
Figure 1B:
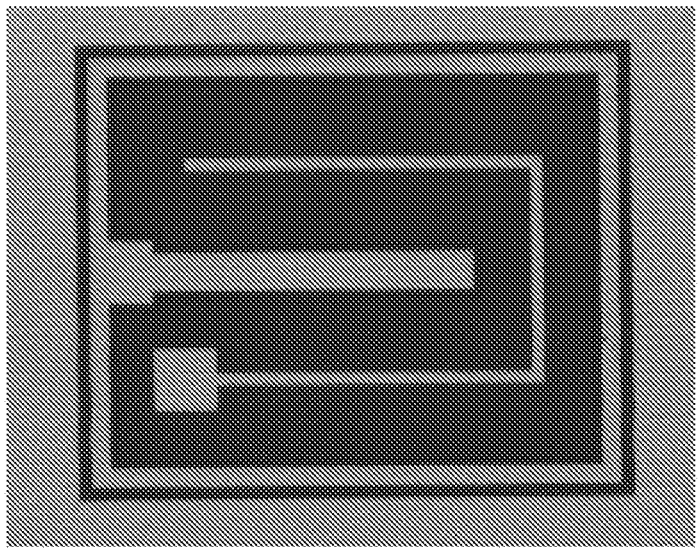
FIG. 1B is an image that shows a simple device with an etched mesa and Ti/Au n-contacts deposited on the top and bottom of the mesa.

FIG. 1B is an image of a sample device having the epitaxial structure of FIG. 1A with an etched mesa and Ti/Au n-contacts deposited on the top and bottom of the mesa.

FIG. 1C is an image of the device of FIG. 1B under a 20 mA injection current, which corresponds to a current density of 20 A/cm². There is no thin metal or TCO on the device so the 400 nm layer of n-GaN on the top serves as the current spreading layer.

A standard LED was processed in a similar geometry to provide a reference LED without a tunnel junction. The same mesa etch was done on the reference LED. A ⅔ nm Pd/Au p-contact layer was put down on top of the mesa. The same Ti/Au metal stack and pattern was used. The Ti/Au on the top of the mesa served as a probing pad and assisted current spreading in the p-contact.

FIG. 1D is an image of the standard LED, without the tunnel junction and with a thin Pd/Au current spreading layer, under a 20 mA injection current which corresponds to a current density of 20 A/cm². The device active area is 0.1 mm².

Figure 1F:
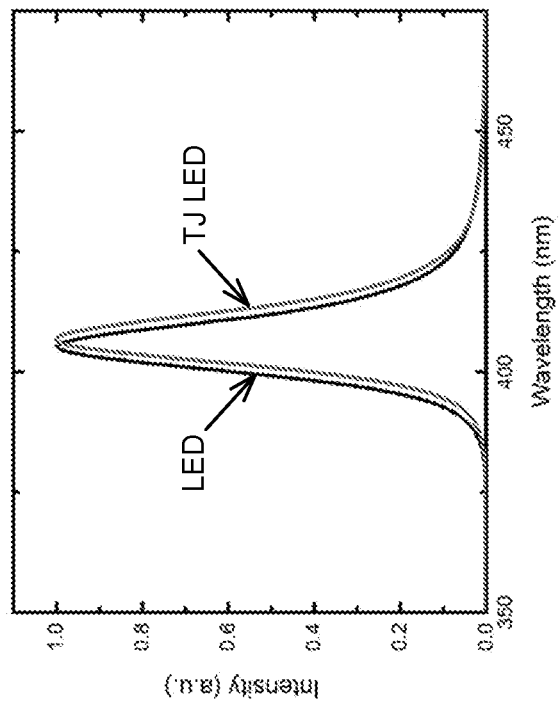
FIG. 1F is a graph of intensity vs. wavelength that compares the spectra of the TJ LED of FIG. 1B to the standard LED of FIG. 1D at a current density of 20 A/cm$^2$.
Figure 1E:
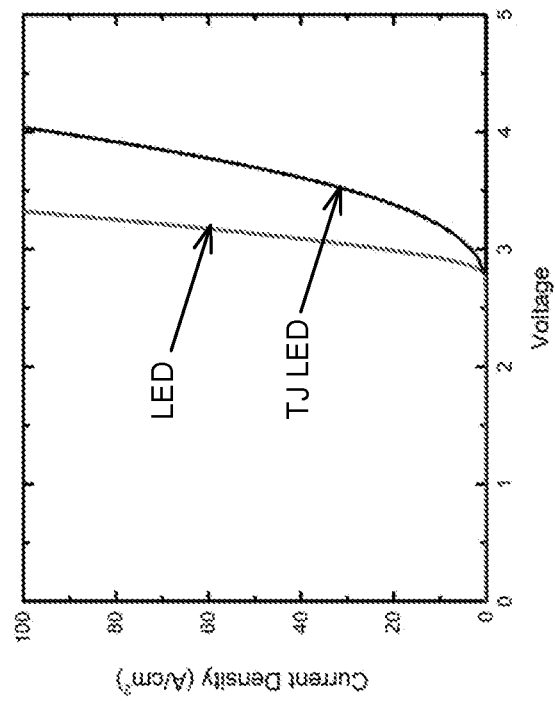
FIG. 1E is a graph of current density vs. voltage that compares the standard LED of FIG. 1D to the TJ LED of FIG. 1B.

FIG. 1E is a graph of current density (A/cm²) vs. voltage that compares the standard LED of FIG. 1D to the TJ LED of FIG. 1B; and FIG. 1F is a graph of intensity (a.u.) vs. wavelength (nm) that compares the spectra of the TJ LED of FIG. 1B to the standard LED of FIG. 1D at a current density of 20 A/cm². In both devices, the active area is 0.1 mm². The IV curve of FIG. 1E shows a slightly higher operating voltage for the tunnel junction, but that could be due to the small n-contact and the n-GaN not being thick enough. The spectra of FIG. 1F is nearly identical, except for the slight wavelength variation, which illustrates the effectiveness of the tunnel junction hole injection into the p-GaN.

Delta-Doping

An improvement can be made to the III-nitride tunnel junction of FIG. 1A by modifying the p-n interface to include an abrupt, extremely thin, highly-doped layer known as a δ-doped (delta-doped) layer, which reduces tunneling resistance.

Figure 2:
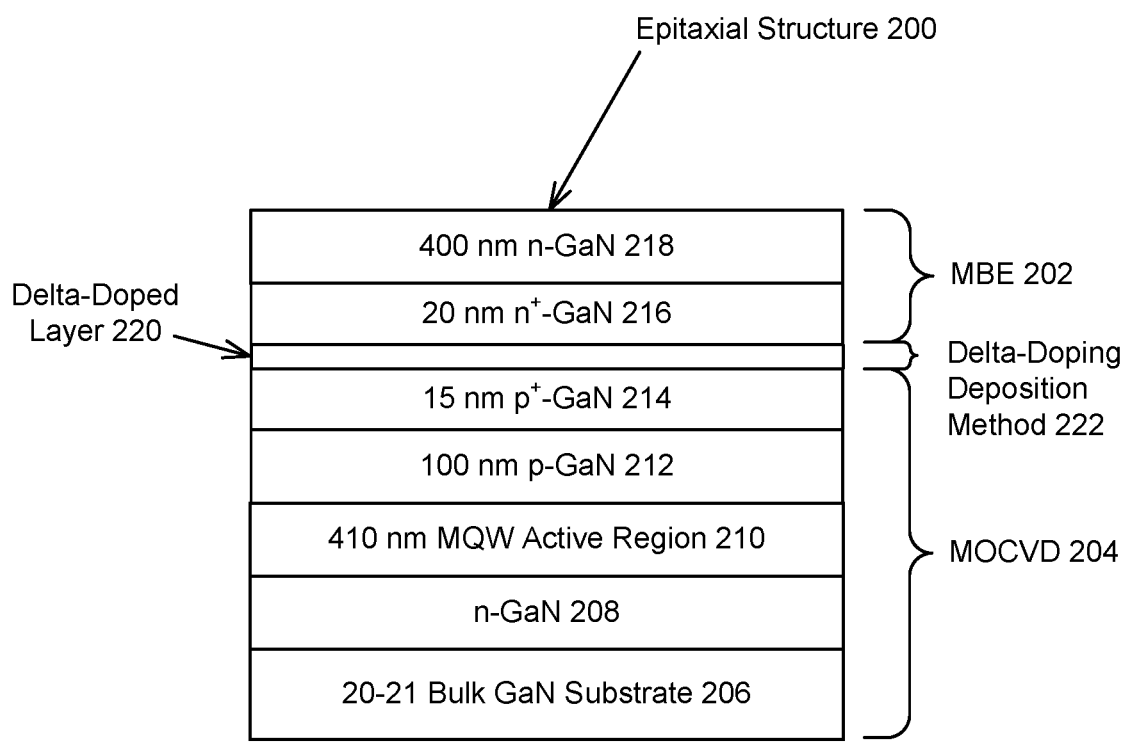
FIG. 2 illustrates an epitaxial structure for an MBE tunnel junction grown on an MOCVD LED with a modified p-n interface including a delta-doped layer.

The epitaxial structure 200 shown in FIG. 2 is similar to FIG. 1A in that it illustrates an MBE tunnel junction grown on an MOCVD LED, wherein the layers of the structure 200 are annotated by their respective MBE 202 or MOCVD 204 growth technique to the right of the layers 206-218. The MOCVD 204 grown LED includes a (20-21) bulk GaN substrate 206, an n-GaN layer 208, a 410 nm emitting MQW active region 210, a 100 nm p-GaN layer 212 and a ~15 nm p⁺-GaN layer 214. An ammonia MBE 102 regrowth is then carried out, which includes a ~20 nm n⁺-GaN layer 216 followed by a 400 nm n-GaN layer 218 for current spreading. The regrowth interface between the ~15 nm p⁺-GaN layer 214 and the ~20 nm n⁺-GaN layer 216 serves as the p-n interface in the tunnel junction.

Thereafter, a mesa etch is performed (not shown) to expose the bottom n-GaN layer 208, as well as isolate the top n-GaN layer 218 from the rest of the substrate 206. A 30/500 nm Ti/Au n-contact layer (not shown) is then deposited using electron beam evaporation on the top and bottom n-GaN layers 218 and 208. As noted above, the use of two n-contacts reduces the processing complexity of LEDs by utilizing a single n-contact deposition. Also, the top n-contact is patterned into a probing pad and a thin strip which utilizes the top n-GaN layer 218 for current spreading.

However, the III-nitride tunnel junction of FIG. 2 differs from the III-nitride tunnel junction of FIG. 1A in that it has a modified p-n interface, wherein the modified p-n interface includes a delta-doped layer 220. The delta-doped layer 220 is annotated by a delta-doping deposition method 222 to the right of the layer 220, which may comprise any number of different methods 222 described below.

The delta-doped layer 220 can be doped using at least one donor atom selected from Oxygen (O), Germanium (Ge) and Silicon (Si); the delta-doped layer 220 can be doped using at least one acceptor atom selected from Magnesium (Mg) and Zinc (Zn); or the delta-doped layer 220 can be doped using at least one impurity selected from Iron (Fe) and Carbon (C), which form a mid-gap energy state allowing for trap assisted tunneling.

These dopants or impurities are deposited at the p-n interface via any number of different delta-doping deposition methods 222 including: a wet chemistry technique, a vapor phase chemistry technique, an atomic layer deposition technique, a physical vapor deposition technique, a plasma based deposition technique, a flux of dopants or impurities, and an ion beam of dopants or impurities.

In one embodiment, the delta-doped layer 220 comprises an n-GaN layer having a thickness from about 0.25 nm to about 1.0 nm, which is doped with O having a donor density from about $2 \times 10^{20}$ cm⁻³ to about $4 \times 10^{21}$ cm⁻³. Oxygen contributes an electron when incorporated into GaN, and this concentration of oxygen is a significant source of charge carriers. In this embodiment, the delta-doped layer 220 can be doped by exposing the delta-doped layer 220 to an oxygen containing environment. In addition, oxidation of the delta-doped layer 220 can be accelerated by using an ozone generator or ozone plasma. Also, the delta-doped layer 220 can be heated to accelerate the oxidation.

Experimental Results

Figure 3:
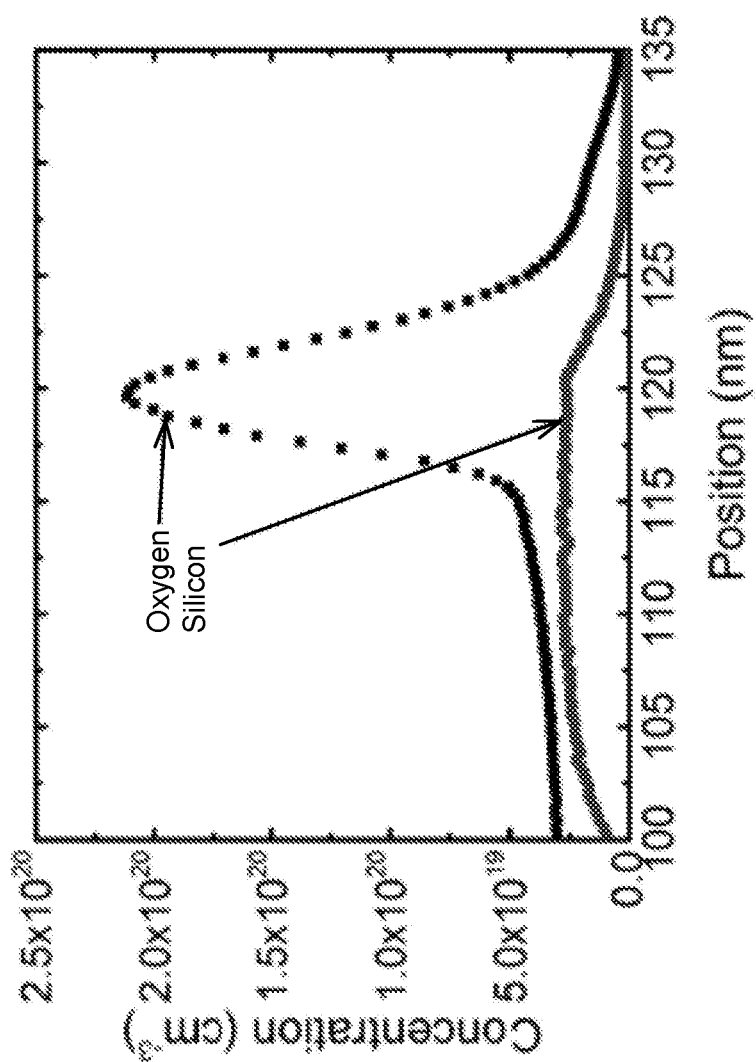
FIG. 3 illustrates the secondary ion mass spectroscopy measurements of silicon and oxygen content in a regrown tunnel junction.

FIG. 3 is a graph of concentration (cm⁻³) vs. position (nm) that illustrates the secondary ion mass spectroscopy (SIMS) measurements of silicon and oxygen content in a regrown tunnel junction similar to the device shown in FIG. 2. The n+/p+ interface is located at about 120 nm, wherein the concentration of oxygen has a maximum of about $2 \times 10^{20}$/cm³ with a Full-Width Half-Maximum (FWHM) of about 7 nm. The SIMS measurements of the regrown tunnel junctions have indicated that a high concentration of residual oxygen is present at the tunnel junction regrowth interface, due to exposure to atmosphere before MBE regrowth. Since oxygen is a dopant atom, i.e., contributes an extra valence electron when incorporated into the GaN lattice, this oxygen is likely a significant source of charge carriers, and acts as a delta-doped layer during operation of the tunnel junction on a device.

Figure 4:
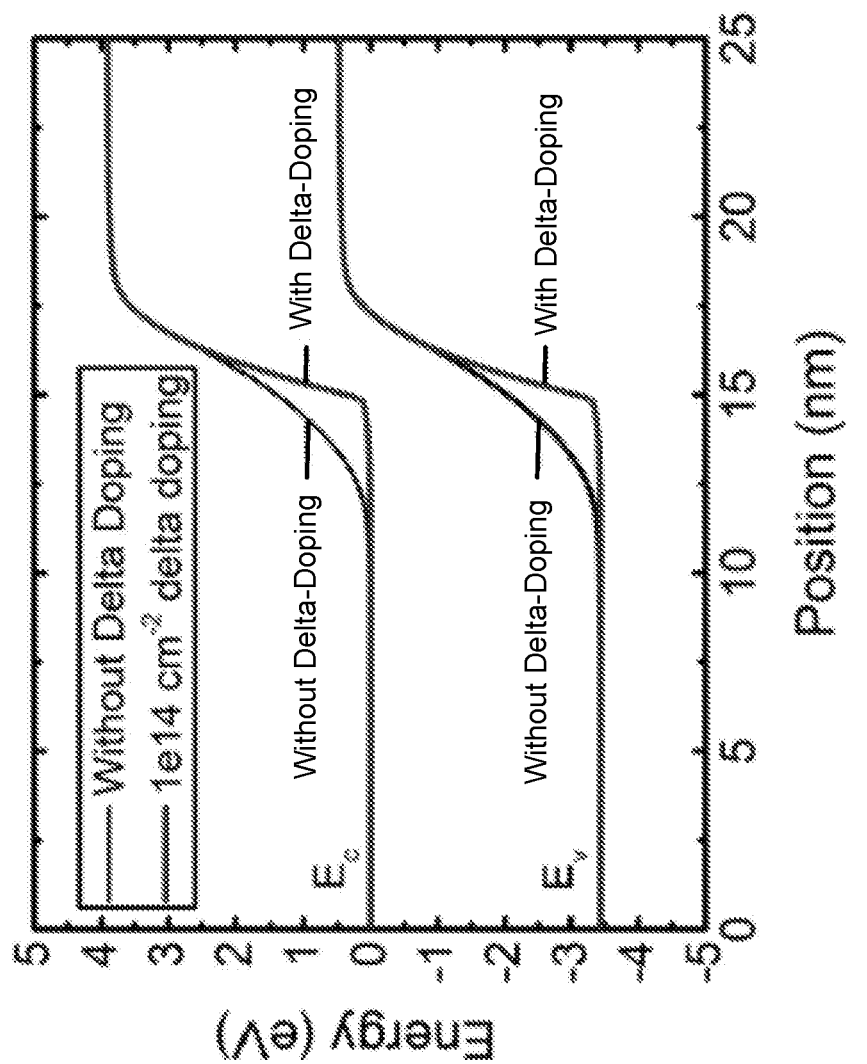
FIG. 4 is a graph of energy vs. position that illustrates a simulated energy band structure of the tunnel junction p+/n+ interface at a reverse bias of 0.5 V with and without delta-doping at the interface.

FIG. 4 is a graph of energy (eV) vs. position (nm) that illustrates a simulated energy band structure of the tunnel junction p+/n+ interface at a reverse bias of 0.5 V with the curves labeled "without delta-doping" and "with delta-doping" for an n-type delta-doped layer at the interface, which was calculated using commercially available software (SiLENSe). The delta-doped layer is modeled as a 0.25 nm thick layer of n-GaN with a donor density of about $4 \times 10^{21}$ cm⁻³ and $1 \times 10^{14}$ cm⁻². Simulated conduction and valence bands of the tunnel junction p+/n+ interface with delta-doping and without delta-doping are shown. The delta-doped layer introduces significant band bending on the p-side of the device, a thinner depletion region, and a significantly reduced tunneling distance.

Figure 5:
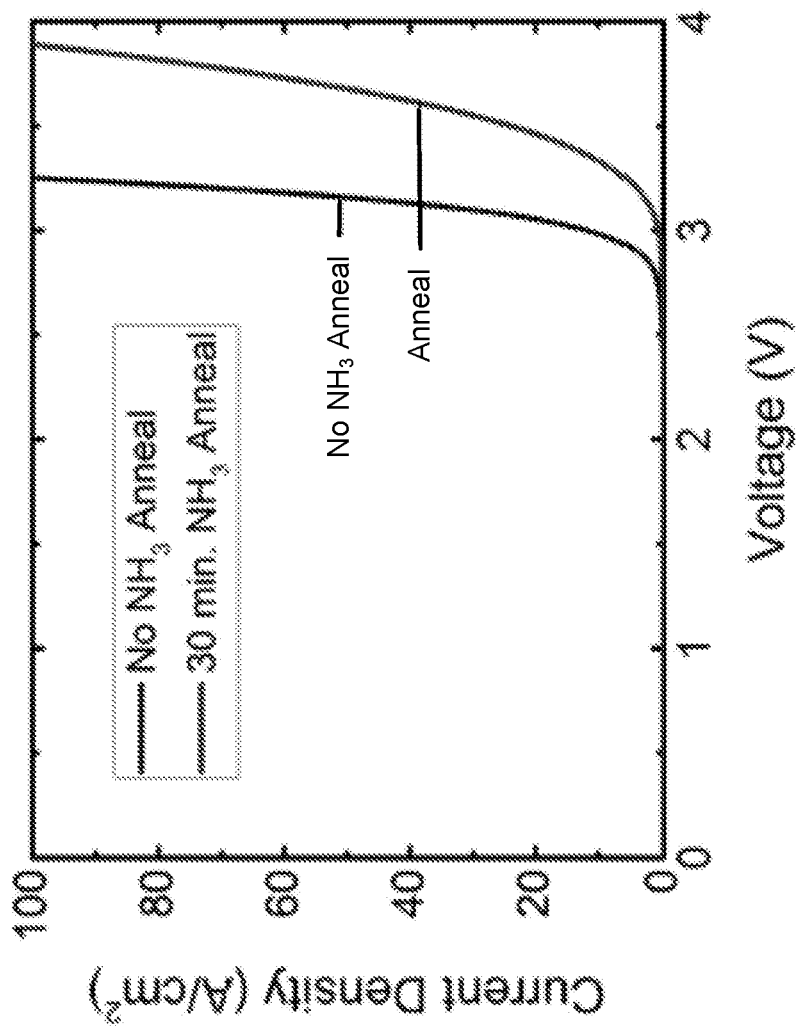
FIG. 5 is graph of current density vs. voltage that shows current-voltage (IV) measurements for two GaN tunnel junctions regrown on the same MOCVD epitaxy.

FIG. 5 is graph of current density (A/cm²) vs. voltage (V) that shows IV measurements for two GaN tunnel junctions regrown on the same MOCVD epitaxy. One sample was annealed at 750° C. under a low pressure of ammonia in the MBE chamber for 30 minutes before regrowth, which has been shown to clean the surface and remove oxygen [6], while the other sample was not annealed prior to regrowth. Annealing removes oxygen at the interface, which increases the voltage drop across the tunnel junction. It can be seen that the turn-on voltage for the device is significantly lower for the sample that has not been annealed, i.e., the presence of residual oxygen improves the performance of the tunnel junction. This enhancement could also be achieved by depositing n-type dopant atoms such as O, Si or Ge at the interface intentionally via a number of deposition techniques described above.

Fabrication Process

Figure 6:
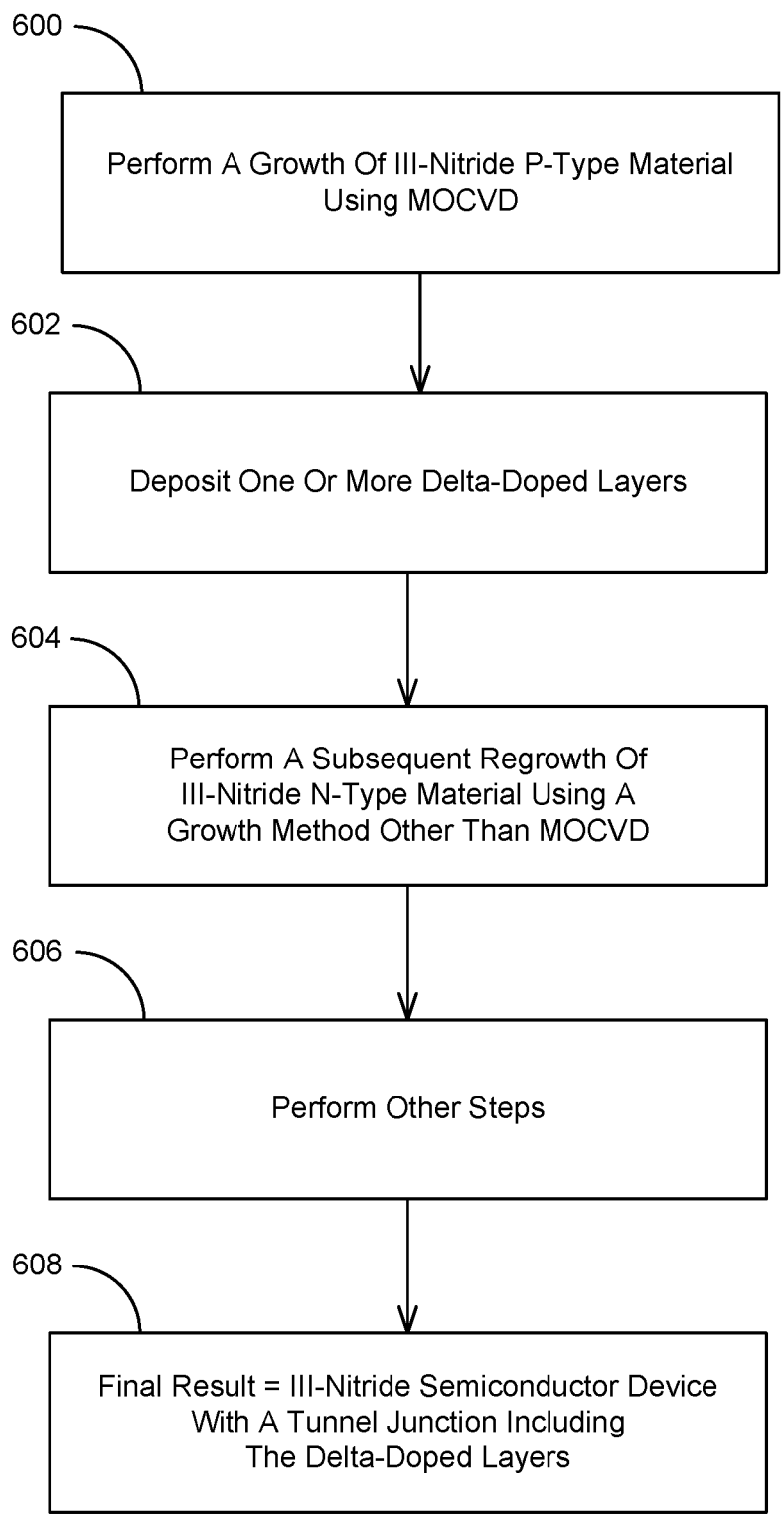
FIG. 6 is a flowchart that illustrates a method for fabricating a III-nitride semiconductor device according to one embodiment.

FIG. 6 is a flowchart that illustrates a method for fabricating a III-nitride semiconductor device, according to one embodiment. Specifically, the steps of the method perform a growth of a III-nitride tunnel junction with a modified p-n interface, wherein the modified p-n interface includes a delta-doped layer to reduce tunneling resistance.

Block 600 represents the step of performing a first growth of the III-nitride tunnel junction with III-nitride p-type material using MOCVD.

Block 602 represents the step of depositing one or more delta-doped layers in, on or above the III-nitride p-type material. In different embodiments, the delta-doped layer is doped using at least one donor atom selected from O, Ge and Si; the delta-doped layer is doped using at least one acceptor atom selected from Mg and Zn; or the delta-doped layer is doped using at least one impurity selected from Fe and C. When oxygen is used, the delta-doped layer is doped by exposing the delta-doped layer to an oxygen-containing environment, wherein oxidation of the delta-doped layer can be accelerated by using an ozone generator or ozone plasma, and the delta-doped layer can be heated to accelerate the oxidation. The delta-doped layer can be deposited using various deposition techniques, including a wet chemistry technique, a vapor phase chemistry technique, an atomic layer deposition technique, a physical vapor deposition technique, a plasma based deposition technique, a flux of dopant atoms or impurities, and an ion beam of dopant atoms or impurities.

Block 604 represents the step of performing a subsequent regrowth of III-nitride n-type material on the delta-doped layer and the III-nitride p-type material using a different growth technique than MOCVD in order to form a III-nitride tunnel junction. For example, the regrowth may be performed using ammonia-assisted or plasma-assisted MBE. In one embodiment, the III-nitride n-type material is grown using a low hydrogen overpressure allowing for the III-nitride p-type material to be activated under the III-nitride n-type material as grown. In addition, the subsequent regrowth can be performed under conditions that prevent passivation of the III-nitride p-type material.

Block 606 represents other steps being performed.

Block 608 represents the final result of the method, namely a III-nitride semiconductor device, such as a light emitting device, light absorbing device, power electronic device, or other optoelectronic device, and including a III-nitride tunnel junction with a modified p-n interface, wherein the modified p-n interface includes a delta-doped layer to reduce tunneling resistance.

The III-nitride semiconductor device comprises: one or more III-nitride p-type layers grown by MOCVD; one or more delta-doped layers deposited in, on or above the III-nitride p-type layers; and one or more III-nitride n-type layers grown on the delta-doped layers and III-nitride p-type layers by a method other than MOVCD, wherein the III-nitride p-type layers, delta-doped layers and III-nitride n-type layers form a tunnel junction, a regrowth interface between the III-nitride p-type layers and the III-nitride n-type layers serves as a p-n interface in the tunnel junction, and the delta-doped layers modify the p-n interface.

Benefits and Advantages

The realization of efficient III-nitride tunnel junctions would potentially allow for multiple advances in the manufacturability of III-nitride optoelectronic devices including LEDs, EELDs, VCSELs, and multijunction solar cells.

Growth of III-nitride tunnel junctions could significantly improve device performance by decreasing operating voltage of devices and allowing for novel device design.

A tunnel junction device could use n-GaN as a current spreading layer on both sides eliminating the need for a TCO or Ag mirror. The elimination of an Ag mirror in a flip chip design would increase reliability and lifetime while reducing processing costs.

The manufacturing process could also be simpler using a tunnel junction design due to fewer processing steps.

The tunnel junctions could also be used to incorporate multiple active regions into a single device. This could increase the performance of EELDs and VCSELs by providing additional gain or reduce the droop in LEDs by achieving more light at the same current density.

REFERENCES

The following publications and patent applications are incorporated by reference herein:
[1] L. Esaki, Physical Review 109, (1958).
[2] J. Simon et al. Science 327 (5961): 60-64.
[3] S. Krishnamoorthy et al, Appl. Phys. Lett. 105, 141104 (2014).
[4] S. Krishnamoorth et al, Nano Lett. 13, 2570-2575 (2013).
[5] P.C.T. International Patent Application No. PCT/US2016/041744, filed on Jul. 11, 2016, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES," which application claims the benefit under 35 U.S.C Section 119(e) of co-pending and commonly-assigned U.S. Provisional Patent Application No. 62/190,929, filed on Jul. 10, 2015, by Erin C. Young, Benjamin P. Yonkee, John T. Leonard, Tal Margalith, James S. Speck, Steven P. DenBaars, and Shuji Nakamura, entitled "HYBRID GROWTH METHOD FOR III-NITRIDE TUNNEL JUNCTION DEVICES".
[6] King, S. W. et al. Cleaning of AlN and GaN surfaces. J. Appl. Phys. 84, 5248-5260.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. A method for fabricating a III-nitride semiconductor device, comprising:
    performing a growth of a III-nitride tunnel junction with a modified p-n interface, wherein the modified p-n interface includes a delta-doped layer that is a III-nitride layer for reducing tunneling resistance as compared to the III-nitride tunnel junction without the delta-doped layer;

wherein the performing step comprises:
performing a first growth of the III-nitride tunnel junction with III-nitride p-type material using metal-organic chemical vapor deposition (MOCVD);
depositing the delta-doped layer in, on or above the III-nitride p-type material; and
performing a subsequent regrowth of the III-nitride tunnel junction with III-nitride n-type material on the delta-doped layer and III-nitride p-type material using a different growth technique than MOCVD.

2. The method of claim 1, wherein the delta-doped layer is doped using at least one acceptor atom selected from Magnesium (Mg) and Zinc (Zn).

3. The method of claim 1, wherein the delta-doped layer is doped using at least one impurity selected from Iron (Fe) and Carbon (C).

4. The method of claim 1, wherein the delta-doped layer is deposited using a wet chemistry technique, a vapor phase chemistry technique, an atomic layer deposition technique, a physical vapor deposition technique, a plasma based deposition technique, a flux of dopant atoms or impurities, or an ion beam of dopant atoms or impurities.

5. The method of claim 1, wherein the subsequent regrowth is performed using ammonia-assisted or plasma-assisted molecular beam epitaxy (MBE).

6. The method of claim 1, wherein the subsequent regrowth is performed under conditions that prevent passivation of the III-nitride p-type material.

7. The method of claim 1, wherein the III-nitride n-type material is grown using a low hydrogen overpressure allowing for the III-nitride p-type material to be activated under the III-nitride n-type material as grown.

8. A III-nitride semiconductor device fabricated by the method of claim 1.

9. The device of claim 8, further comprising a light emitting device, light absorbing device, power electronic device, or other optoelectronic device.

10. The method of claim 1, wherein the delta-doped layer is doped using at least one donor atom selected from Oxygen (O), Germanium (Ge) and Silicon (Si).

11. The method of claim 10, wherein the delta-doped layer is doped by exposing the delta-doped layer to an oxygen-containing environment.

12. The method of claim 11, wherein oxidation of the delta-doped layer is accelerated by using an ozone generator or ozone plasma.

13. The method of claim 12, wherein the delta-doped layer is heated to accelerate the oxidation.

14. A III-nitride semiconductor device, comprising:
a III-nitride tunnel junction with a modified p-n interface, wherein the modified p-n interface includes a delta-doped layer that is a III-nitride layer for reducing tunneling resistance as compared to the III-nitride tunnel junction without the delta-doped layer, wherein:
a first growth of the III-nitride tunnel junction with III-nitride p-type material is performed using metal-organic chemical vapor deposition (MOCVD);
the delta-doped layer is deposited in, on or above the III-nitride p-type material; and
a subsequent regrowth of the III-nitride tunnel junction with III-nitride n-type material on the delta-doped layer and III-nitride p-type material is performed using a different growth technique than MOCVD.

15. The device of claim 14, wherein the III-nitride tunnel junction further comprises:
III-nitride p-type material;
the delta-doped layer deposited in, on or above the III-nitride p-type material; and
III-nitride n-type material regrown on the delta-doped layer and III-nitride p-type material.

16. The device of claim 14, wherein the delta-doped layer is doped using at least one donor atom selected from Oxygen (O), Germanium (Ge) and Silicon (Si).

17. The device of claim 14, wherein the delta-doped layer is doped using at least one acceptor atom selected from Magnesium (Mg) and Zinc (Zn).

18. The device of claim 14, wherein the delta-doped layer is doped using at least one impurity selected from Iron (Fe) and Carbon (C).

19. A III-nitride semiconductor device, comprising:
one or more III-nitride p-type layers grown by metal-organic chemical vapor deposition (MOCVD);
one or more delta-doped layers that are III-nitride layers deposited in, on or above the III-nitride p-type layers; and
one or more III-nitride n-type layers grown by ammonia-assisted or plasma-assisted molecular beam epitaxy (MBE) on the delta-doped layers and III-nitride p-type layers;
wherein the III-nitride p-type layers, delta-doped layers and III-nitride n-type layers form a tunnel junction, a regrowth interface between the III-nitride p-type layers and the III-nitride n-type layers serves as a p-n interface in the tunnel junction, and the delta-doped layers modify the p-n interface by reducing tunneling resistance as compared to the tunnel junction without the delta-doped layers.

* * * * *